United States Patent [19]
Ishikawa

[11] Patent Number: 6,071,832
[45] Date of Patent: Jun. 6, 2000

[54] METHOD FOR MANUFACTURING A RELIABLE SEMICONDUCTOR DEVICE USING ECR-CVD AND IMPLANTING HYDROGEN IONS INTO AN ACTIVE REGION

[75] Inventor: Hiraku Ishikawa, Tokyo, Japan

[73] Assignee: NEC Corporation, Japan

[21] Appl. No.: 08/822,117

[22] Filed: Mar. 21, 1997

[30] Foreign Application Priority Data

Mar. 25, 1996 [JP] Japan ..................................... 8-068130

[51] Int. Cl.[7] .......................... H01L 21/31; H01L 21/469
[52] U.S. Cl. .......................... 438/787; 438/624; 438/637; 438/675; 438/680; 938/788; 156/345
[58] Field of Search .............................................. 438/788

[56] References Cited

U.S. PATENT DOCUMENTS

| | | |
|---|---|---|
| 4,984,055 | 1/1991 | Okumura et al. . |
| 5,200,808 | 4/1993 | Koyama et al. . |
| 5,296,399 | 3/1994 | Park . |
| 5,431,769 | 7/1995 | Kisakibaru et al. . |
| 5,554,565 | 2/1996 | Liaw et al. . |
| 5,571,571 | 11/1996 | Musaka et al. . |
| 5,578,524 | 11/1996 | Fukase et al. . |
| 5,661,084 | 8/1997 | Kuo et al. . |
| 5,861,674 | 1/1999 | Ishikawa . |
| 5,882,975 | 3/1999 | Ishikawa . |

FOREIGN PATENT DOCUMENTS

| | | | |
|---|---|---|---|
| 60-97628 | 5/1985 | Japan ............................. | H01L 21/318 |
| 401272121A | 10/1989 | Japan . | |
| 4-186675 | 7/1992 | Japan ............................. | H01L 29/784 |
| 5-129333 | 5/1993 | Japan ............................. | H01L 21/336 |

OTHER PUBLICATIONS

Wolf, S., Silicon Processing for the VLSI Era–vol. 2, pp. 237–8, 1990.

Mayer et al, Electronic Materials Science: For Integrated ciruits in Si and GaAs, pp. 267, 1990.

Fukuda, et al "High quality high rate SiO2 and SiN room temperature formation by utilizing high excited ions," IEEE IEDM pp. 285–288, 1990.

"The influence of plasma annealing on electrical properties of polycrystalline Si" Makino et al.

1979 American Institute of Physics; Appl. Phys. Lett. 35(7); Oct. 1, 1979; pp. 551–552.

"Improvement of Water–Relatd Hot–Carrier Reliability by Using ECR Plasma–$SiO_2$" Machida et al.

IEEE Transactions on Electron Devices, vol. 41, No. 5; May 1994; pp. 709–713.

"Deuterium passivation of grain–boundary dangling bonds in silicon thin films" Johnson et al.

1982 American Institute of Physics; Appl. Phys. Lett. 40(10); May 15, 1982; p. 882.

*Primary Examiner*—John F. Niebling
*Assistant Examiner*—Jonathan Hack
*Attorney, Agent, or Firm*—Hayes, Soloway, Hennessey, Grossman & Hage, P.C.

[57] ABSTRACT

A method for manufacturing a semiconductor device having a high durability against a hot carrier problem and reliable transistor characteristics comprises the steps of forming a first silicon oxide film by atmospheric pressure CVD, forming a silicon nitride film by low pressure CVD to a thickness of 30 to 200 angstroms, and forming a silicon oxide film by biased electron cyclotron resonance CVD (ECR-CVD) using a silane gas as a source material while applying a radio frequency electric field to the substrate. The ECR-CVD silicon oxide film provides a sufficient amount of active hydrogen ions, and silicon nitride film allows movement of an adequate amount of the active hydrogen ions to thereby eliminate the hot carrier problem and recovery of transistor characteristics from the plasma damage.

8 Claims, 6 Drawing Sheets

METHOD FOR MANUFACTURING A RELIABLE SEMICONDUCTOR DEVICE USING ECR-CVD AND IMPLANTING HYDROGEN IONS INTO AN ACTIVE REGION

BACKGROUND OF THE INVENTION (a) Field of the Invention

The present invention relates to a method for manufacturing a semiconductor device and, more particularly, to a method for manufacturing a semiconductor device having improved characteristics.

(b) Description of the Related Art

With the recent improvement of a semiconductor device in integration and operational speed, transistor dimensions are remarkably reduced, which in turn focuses the difficulty in obtaining a high reliability for the transistors.

Patent Publication No. JP-A-1985-97628, for example, proposes a first technique for fabricating a semiconductor device in which a silicon nitride film overlying an active layer for a transistor is deposited by a plasma enhanced chemical vapor deposition (PECVD). The silicon nitride film provides therefrom a large amount of active hydrogen ions to the silicon active layer during a heat treatment of overlying layers, the active hydrogen ions providing passivation of dangling bonds in the silicon substrate to thereby recover the transistor characteristics damaged by a plasma or ion-implantation step.

The semiconductor device having the PECVD silicon nitride film as described above, however, suffers from a low durability against a hot carrier problem. The reason therefor is that a heat treatment for the PECVD silicon nitride film produces defects caused by desorption of hydrogen in the silicon nitride film, and water (moisture) or hydrogen ions will diffuse through the defects into the active layer.

Patent Publication No. JP-A-1983-129333 proposes a second technique to solve the hot carrier problem, in which a first silicon nitride film overlying an active layer is formed by a low-pressure CVD (LPCVD) technique and a second silicon nitride film is formed by a PECVD technique, whereby hydrogen ions from the PECVD nitride film are stopped by LPCVD silicon nitride film and provided through a metallic plug, which is connected to the active layer, into the active layer to provide passivation of the dangling bonds.

Patent Publication No. JP-A-1992-188675 proposes a third technique to solve the hot carrier problem, in which a first silicon nitride film overlying an active layer is deposited by a LPCVD technique, and a second silicon nitride film is deposited by a PECVD technique as a final layer for stopping the hydrogen ions.

FIGS. 1A to 1D show consecutive steps for the third conventional method as an example for solving the hot carrier problem. In FIG. 1A, a gate insulating film 12 and a gate polycrystalline silicon (polysilicon) film 13 are consecutively formed on a silicon substrate 11, followed by introduction of impurity ions by using the gate structure as a mask for forming lightly doped diffused regions in the silicon substrate 11. Subsequently, side walls 15 are formed on the gate structure and highly doped diffused regions 14 for source and drain are formed by ion-implantation using the side walls 15 as an additional mask. The gate polysilicon film 13 and heavily doped regions 14 are electrically separated from each other by the side walls 15.

Subsequently, as shown in FIG. 1B, a silicon oxide film 16 is formed on the entire surface, and a first silicon nitride film 17 is then deposited thereon, as shown in FIG. 1C, by a LPCVD technique. Thereafter, an interlayer insulating film 22 is formed on the first silicon nitride film 17, followed by deposition of a second silicon nitride film 23 by a PECVD technique.

In the second and third conventional methods, hot carrier problem can be solved to some extent. However, transistor characteristics are poor due to plasma damage etc. Specifically, Ti etc. in the metallic plug in the second method will absorbs hydrogen so that an adequate amount of active hydrogen ions is not provided to the active layer in the substrate, although the adequate amount of active hydrogen ions is necessary for passivation of dangling bonds in the silicon substrate to recover the silicon surface from a plasma damage etc. The first silicon nitride film 17 in the third method also prevents an adequate amount of active hydrogen ions from being diffused from the second silicon nitride film 23 to the active layer 14 in the silicon substrate 11.

SUMMARY OF THE INVENTION

It is an object of the present invention to provide a method for manufacturing a semiconductor device having excellent transistor characteristics and a reliable durability against a hot carrier problem.

In accordance with a first aspect of the present invention, there is provided a method for manufacturing a semiconductor device comprising the steps of forming an active layer for a transistor on a semiconductor substrate, forming a first insulating film overlying the active layer, forming a silicon nitride film on the first insulating film, and forming a silicon oxide film on the silicon nitride film by a plasma enhanced chemical vapor deposition (PECVD) technique using a compound of silicon and hydrogen while applying a radio frequency electric field to said substrate.

In accordance with a second aspect of the present invention, there is provided a method for manufacturing a semiconductor device comprising the steps of forming an active layer for a transistor on a semiconductor substrate, forming a first insulating film overlying the active layer, forming a silicon nitride film on the first insulating film, forming a second insulating film on the silicon nitride film, forming a metallic plug penetrating the first insulating film, silicon nitride film and second insulating film to reach the active layer, forming a metallic layer on the second insulating film and the metallic plug, and forming a silicon oxide film on the silicon nitride film by a plasma enhanced chemical vapor deposition (PECVD) technique using a compound of silicon and hydrogen while applying a radio frequency electric field to said substrate.

In accordance with the methods according to the present invention, an adequate amount of active hydrogen ions is provided from the overlying silicon oxide film formed by an electron cyclotron resonance CVD (ECR-CVD) technique, for example, through the silicon nitride film to the active layer of the silicon substrate, so as to recover the silicon surface from a plasma damage etc. while assuring a sufficient durability against the hot carrier problem.

The above and other objects, features and advantages of the present invention will be more apparent from the following description, referring to the accompanying drawings.

DESCRIPTION OF THE PREFERRED EMBODIMENTS

Figure 1A:
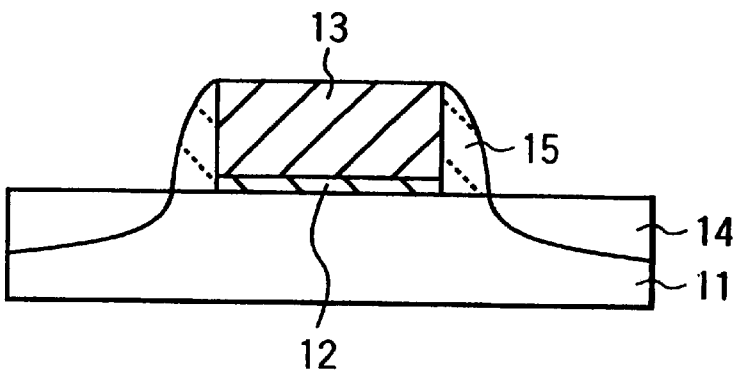
FIGS. 1A to 1D are cross-sectional views of a semiconductor device in consecutive steps for manufacturing the semiconductor device in a conventional method.
Figure 1B:
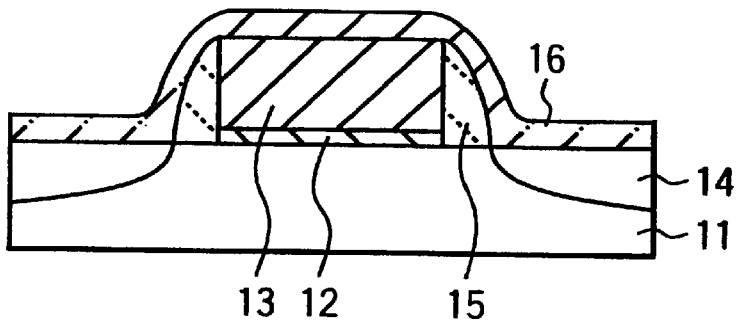
Figure 1C:
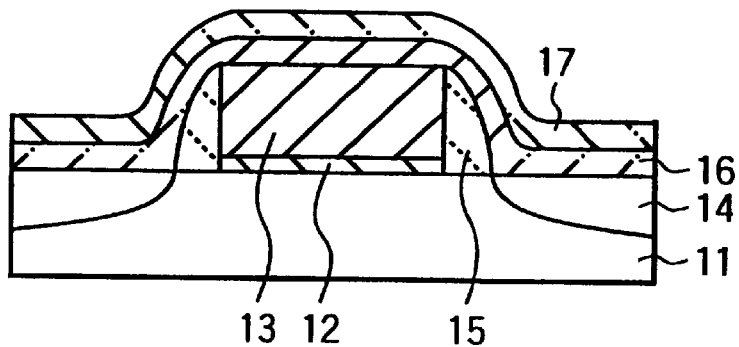
Figure 1D:
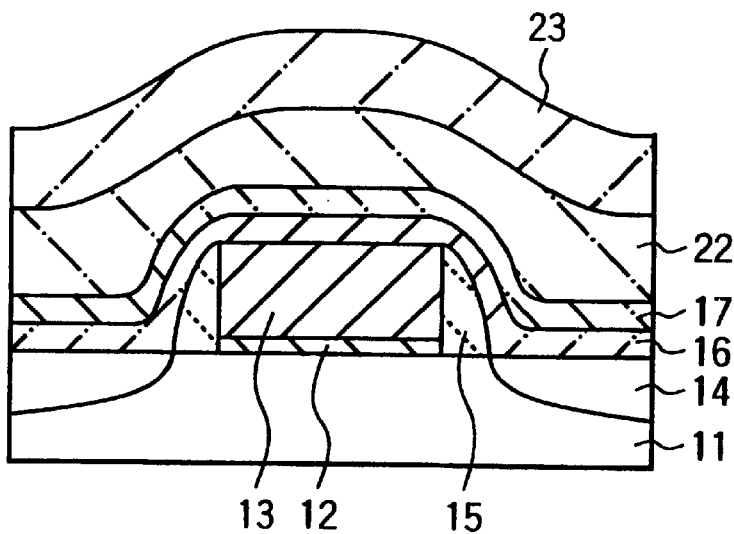

Now the present invention will be described in more detail with reference to accompanying drawings, wherein similar constituent elements are designated by the same reference numerals throughout the drawings.

Figure 2A:
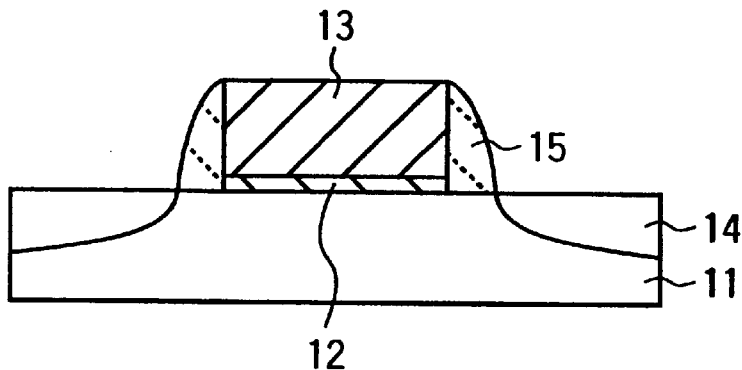
FIGS. 2A to 2D are cross-sectional views of a semiconductor device in consecutive steps for manufacturing the semiconductor device according to a first embodiment of the present invention.

FIGS. 2A to 2D show consecutive steps in a method for manufacturing a semiconductor device according to a first embodiment of the present invention. In FIG. 2A, a gate insulating ($SiO_2$) film 12 and a gate polysilicon film 13 are consecutively formed on a silicon substrate 11, followed by an ion-implantation of impurities at a low dosage by using the gate structure as a mask to form lightly doped regions in the silicon substrate 11. Subsequently, a first silicon oxide film is deposited by a CVD technique on the entire surface and etched back by an anisotropic reactive ion etching (RIE) to form side walls 15 on the gate structure. Thereafter, impurity ions are again introduced into the lightly doped regions by using the side walls 15 as an additional mask to form heavily doped regions 14 for source and drain. The gate polysilicon film 13 and heavily doped region 14 for source or drain are separated from each other by the side wall 15.

Figure 2B:
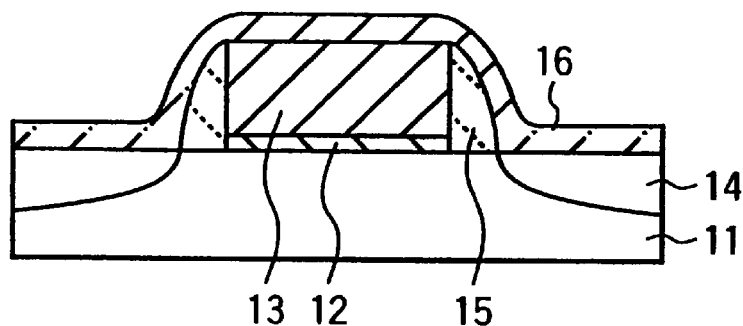
Figure 2C:
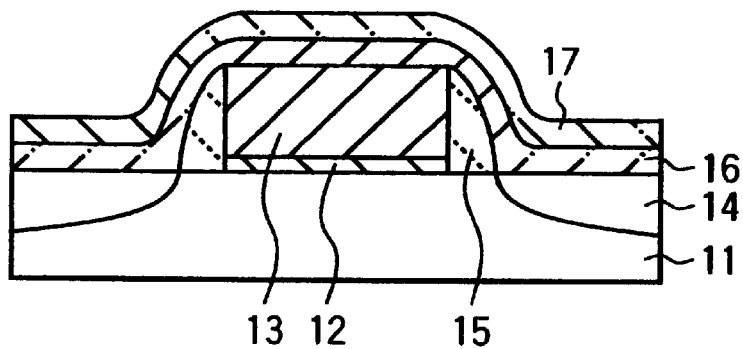
Figure 2D:
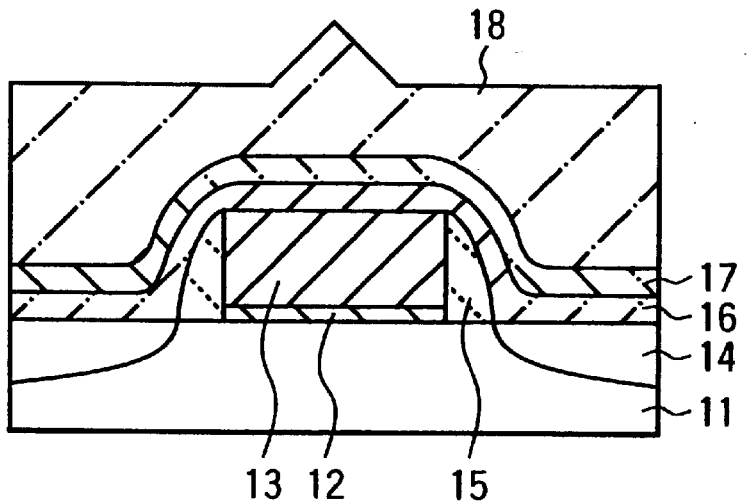

Subsequently, as shown in FIG. 2B, a second silicon oxide film 16 is deposited by an atmospheric pressure CVD (APCVD) on the entire surface, followed by deposition of a silicon nitride film thereon by LPCVD to a thickness of 30 to 200 angstroms. Thereafter, a third silicon oxide film 18 is deposited on the silicon nitride film 17 by a PECVD technique using a biased ECR-CVD unit, as shown in FIG. 2D.

Figure 3:
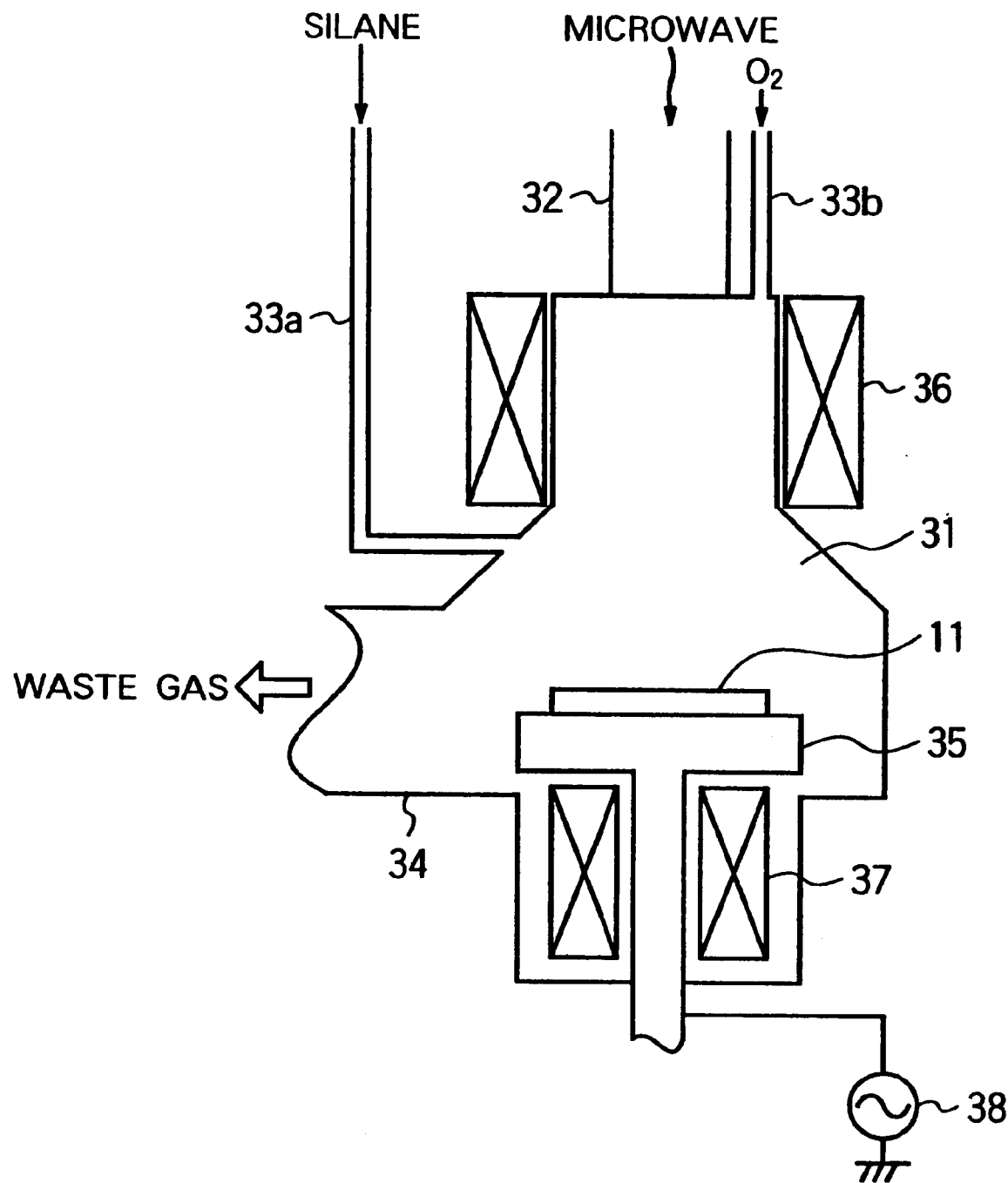
FIG. 3 is a cross-sectional view of a biased ECRCVD unit used in the method according to the embodiments of the present invention.

FIG. 3 shows a schematic configuration of the biased ECR-CVD unit. The biased ECR-CVD unit includes a plasma chamber 31 having a microwave inlet 32 for introducing a microwave, gas inlets 33a and 33b for introducing a reactive gas and oxygen gas, respectively, and a gas outlet 34 for discharging a waste gas.

The plasma chamber 31 receives therein a susceptor 35, on which a silicon substrate 11 under working is mounted. The susceptor 35 is connected to a high frequency (or radio frequency) power source 38 for biasing the same. The plasma chamber 31 is provided with a main coil 36 and an auxiliary coil 37 for applying a magnetic field to the plasma chamber 31.

In operation of the ECR-CVD unit at the ECR-CVD step, microwave energy is applied to the plasma chamber 31 while introducing oxygen gas ($O_2$) through the gas inlet 33b to the plasma chamber 31, to thereby generate a gas plasma. In this state, argon and a silane, for example, monosilane, are supplied through the gas inlet 33a to deposit the silicon oxide film on the silicon nitride film. During this step, a high frequency electric field (RF bias) is applied to the susceptor 35 to preform the deposition in an argon gas plasma ambient.

The ECR-CVD step is preformed under the condition of, for example, silane flow rate at 30 sccm, oxygen flow rate at 45 sccm, argon flow rate at 70 sccm, microwave energy at 2000 watts, RF bias power at 1400 watts, and substrate temperature at about 350° C. In this step, the silane gas which is used as a source material is decomposed in the ECR plasma ambient to generate a large quantity of active hydrogen ions. The active hydrogen ions thus generated are accelerated by the high frequency electric field applied to the silicon substrate 11 to be injected into the active layer of the silicon substrate 11. The silane gas may be selected from monosilane, disilane, dichlorosilane etc.

Injection of the active hydrogen ions as mentioned above is described in a literature entitled "The influence of plasma annealing on electrical properties of polycrystalline Si" by T. Makino et al., Appl. Phys. Lett. 35, pp 551, wherein the resistivity of lightly doped polysilicon film is reduced by injecting active hydrogen ions into the polysilicon film.

Several cases were selected to confirm the reduction of the resistivity of an underlying polysilicon film, on which the following insulating films were deposited:

(a) first case: silicon oxide film deposited by APCVD directly on the polysilicon film;

(b) second case: silicon oxide film deposited by biased ECR-CVD on a silicon nitride film, which is deposited by LPCVD on another silicon oxide film deposited by APCVD on the polysilicon film; and (c) third case: silicon oxide film deposited by ECR-CVD on another silicon oxide film deposited by APCVD on the polysilicon film. The test results are shown in FIG. 4 in which resistivity of the polysilicon film is scaled in logarithm.

Figure 4:
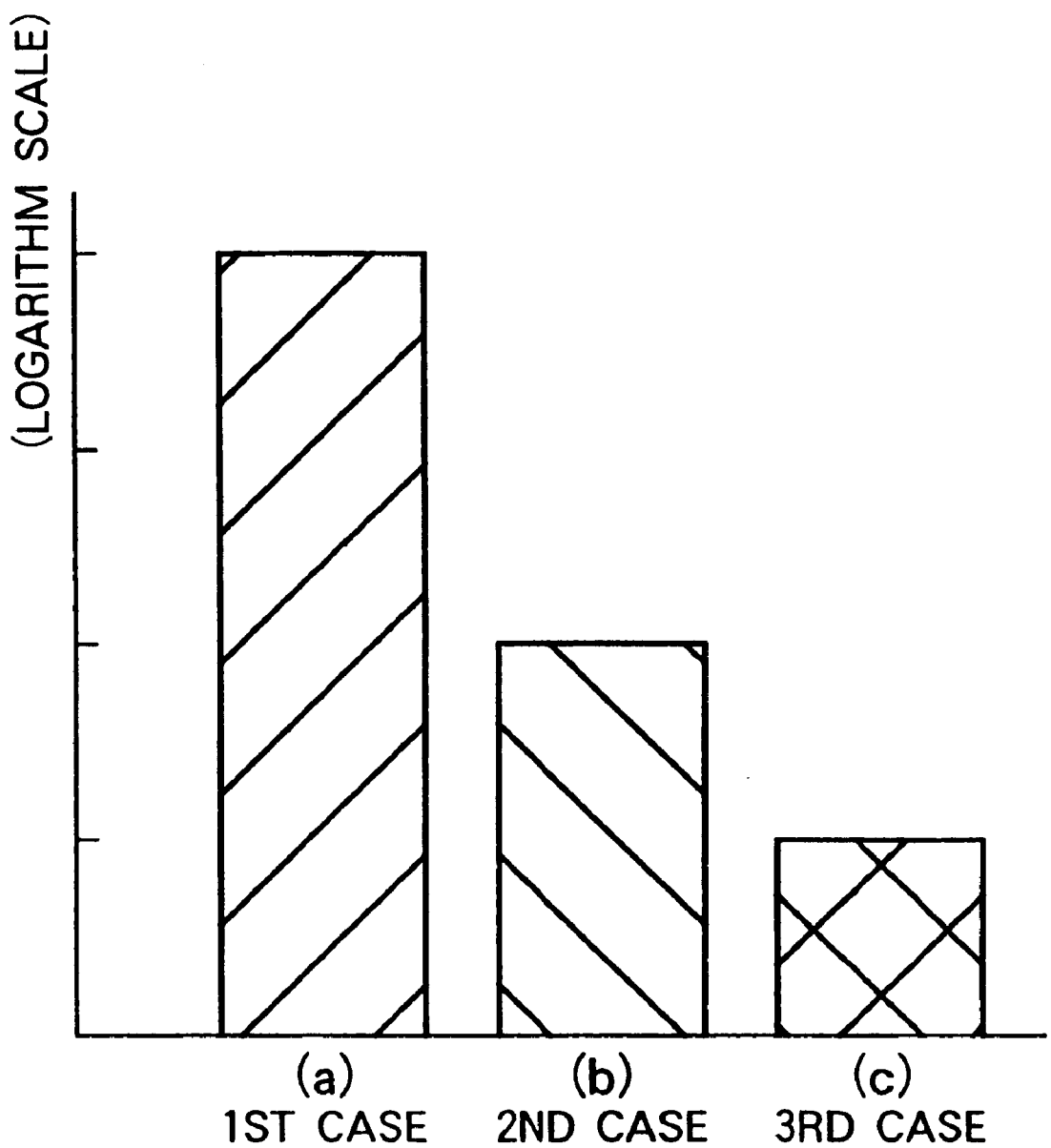
FIG. 4 is a graph showing the reduction of resistivity of a polysilicon film underlying specific insulating film structures.

FIG. 4 illustrates that polysilicon film of the first case exhibited a highest resistivity, polysilicon film of the second case exhibited a lower resistivity by two order as compared to the first case, and polysilicon film of the third case exhibited a lowest resistivity which is lower by three order as compared to the first case. It is considered that the remarkable reduction of the resistivity in the third case is due to a large amount of active hydrogen ions being injected into the polysilicon film during the deposition of the silicon oxide film by using the biased ECR-CVD. In this respect, the silicon nitride film deposited by LPCVD between both the silicon oxide films in the second case has a function of inhibiting the passing of the active hydrogen ions to some extent.

By the above experiments, it is confirmed that the silicon nitride film, as deposited between the silicon oxide films deposited by biased ECR-CVD and APCVD according to the embodiment, has a function of inhibiting an excess amount of active hydrogen ions diffusing into the active layer for a transistor and permitting an adequate amount of active hydrogen ions diffusing into the active layer. The adequate amount of the active hydrogen ions allows recovery of transistor characteristics from damages due to plasma or ion-implantation. The silicon nitride film inhibits also movement of the water and active hydrogen ions into the active layer of the substrate from other overlying interlayer insulating films formed during subsequent steps in the semiconductor device.

Figure 5A:
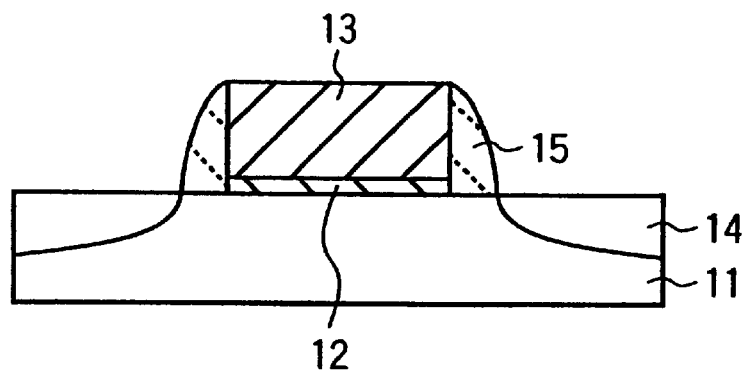
FIGS. 5A to 5F are cross-sectional views of a semiconductor device in consecutive steps for manufacturing the semiconductor device according to a second embodiment of the present invention.

FIGS. 5A to 5F show consecutive steps for manufacturing a semiconductor device according to a second embodiment of the present invention. In FIG. 5A, a gate insulating film 12 and a gate polysilicon film 13 are consecutively formed on a silicon substrate 11, followed by ion-implantation at a low dosage into the silicon substrate 11 by using the gate structure as a mask to form lightly doped regions. Subsequently, a first silicon oxide film is deposited on the entire surface on a polysilicon film 13 by an APCVD technique, and etched back by using an anisotropic etching technique to form side walls 15 on the gate structure. Impurity ions are then introduced again by using the side walls 15 as an additional mask to form heavily doped regions 14 for source and drain in the lightly doped regions. After this step, the gate polysilicon film 13 and heavily doped region 14 are electrically separated from each other by the side wall 15.

Figure 5B:
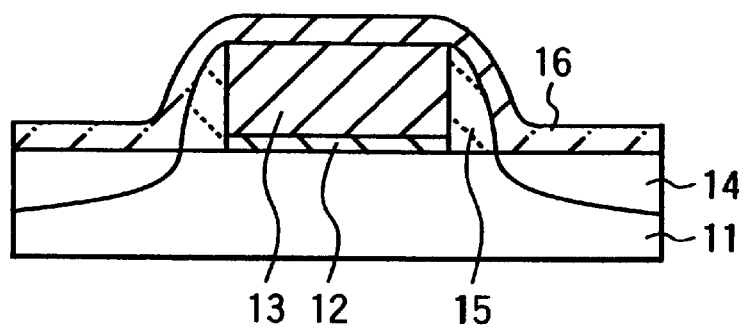
Figure 5C:
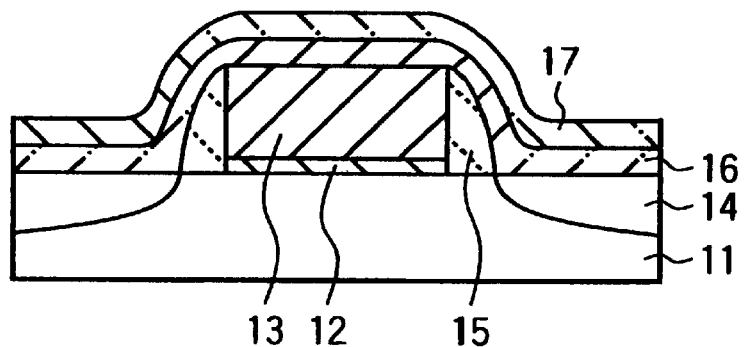

Subsequently, a second silicon oxide film 16 is deposited by APCVD, as shown in FIG. 5B, followed by deposition of a silicon nitride film 17 thereon by LPCVD to a thickness of 30 to 200 angstroms, as shown in FIG. 5C.

Figure 5D:
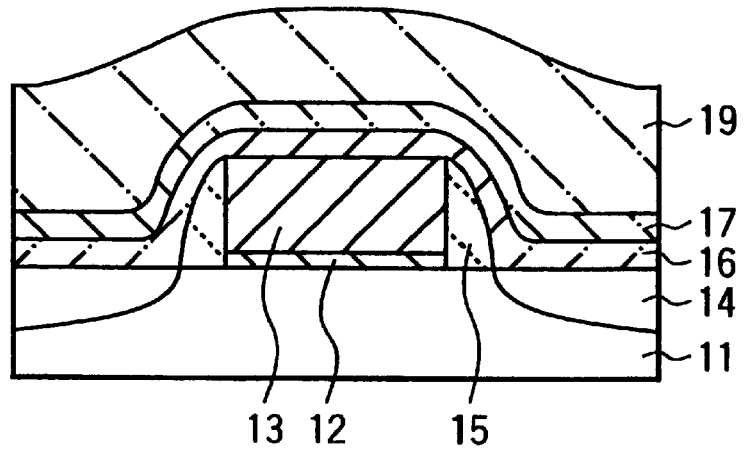
Figure 5E:
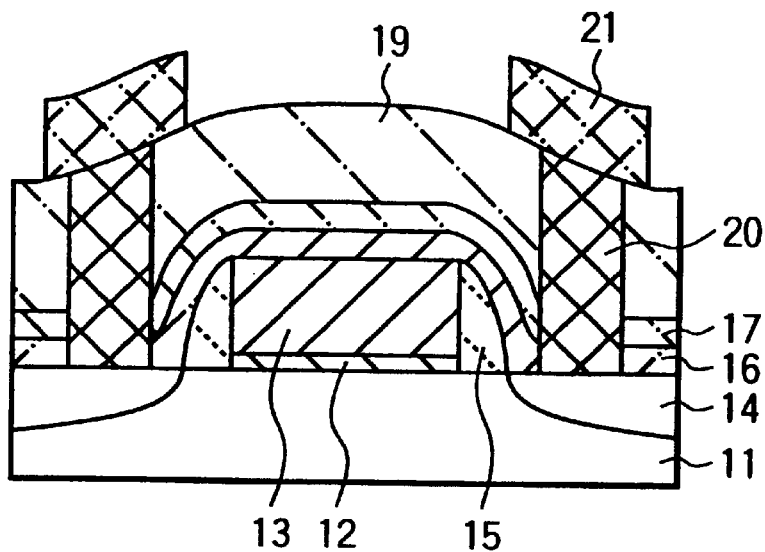
Figure 5F:
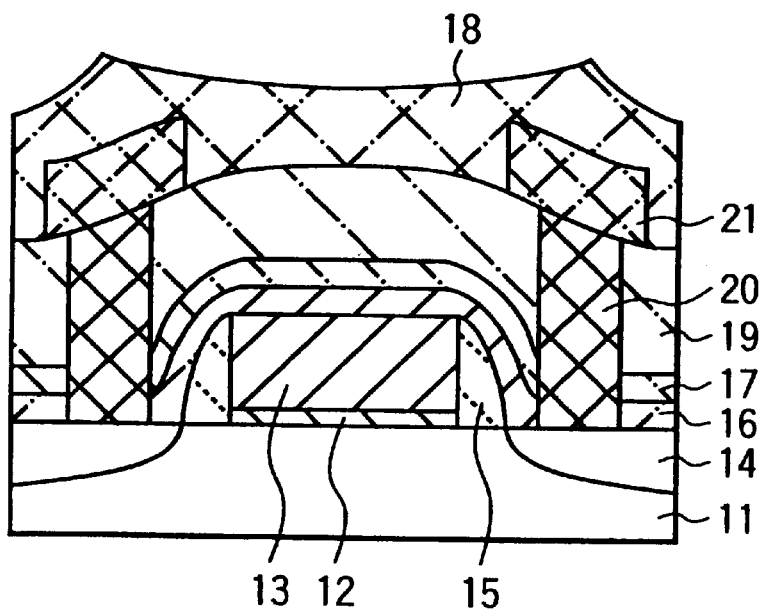

Thereafter, a BPSG (boron-phosphide-silicate glass) film 19 is deposited by LPCVD or APCVD on the silicon nitride film 17, as shown in FIG. 5D. The BPSG film 19 has a function for prevention of contamination of active layer by sodium ions or metal in the subsequent steps. Through-holes 20 are then formed in the insulating layers 16, 17 and 19 to reach the heavily doped regions 14 for source and drain and are filled with a metal such as tungsten, followed by deposition of a metallic layer for interconnects 21, as shown in FIG. 5E.

A third silicon oxide film 18 is then deposited on the entire surface including the surface of the metallic interconnects 21 and BPSG film 19 by PECVD using a biased ECR-CVD unit such as shown in FIG. 3. The deposition is executed under the condition of, for example, silane flow rate at 30 sccm, oxygen flow rate at 45 sccm, argon flow rate at 70 sccm, microwave energy at 2000 watts, RF bias power at 1400 watts, and substrate temperature at about 350° C. Silane or silane gas as used herein means a compound of silicon and hydrogen, such as monosilane, disilane and dichlorosilane.

During the deposition by the biased ECR-CVD unit, the silane gas used as a source material is decomposed to generate a large amount of active hydrogen ions. The hydrogen ions thus generated are accelerated by the high frequency electric field applied to the silicon substrate 11 to be injected into the active regions of the substrate for transistors through the BPSG film 19, silicon nitride film 16 formed by LPCVD, and second silicon oxide film 16 formed by APCVD.

The silicon nitride film 17 deposited by LPCVD between the BPSG film formed by LPCVD (or APCVD) and the silicon oxide film 16 formed by APCVD has a function for inhibiting movement of excess hydrogen ions during the deposition of the silicon oxide film 18 by biased ECR-CVD, as in the case of the first embodiment.

The silicon nitride film 17 in the second embodiment also permits movement of an adequate amount of hydrogen ions to be injected into the active regions of the transistor thus formed, to thereby allow recovery of the transistor characteristics from a plasma damage etc. The silicon nitride film 17 also prevents movement of the water and excess hydrogen ions from the overlying interlayer insulating films formed in the subsequent steps in the semiconductor device.

In the above embodiments, active layer is formed in the silicon substrate at the main surface thereof. However, the active layer may be formed on the main surface as a separate layer. In this text, both the active layers are recited as formed on the substrate.

Although the present invention is described with reference to preferred embodiments thereof, the present invention is not limited thereto and various modifications or alterations can be easily made from the embodiments by those skilled in the art without departing from the scope of the present invention as set forth in the appended claims.

What is claimed is:

1. A method for forming a semiconductor device comprising the steps of forming an active layer for a transistor on a semiconductor substrate, forming a first insulating film overlying said active layer, forming a silicon nitride film on said first insulating film, and forming a silicon oxide film on said silicon nitride film by conducting a plasma enhanced chemical vapor deposition ECR-CVD process in a plasma chamber using a compound of silicon and hydrogen while applying (1) a radio frequency electric field to said substrate, and (2) a magnetic field to the plasma chamber, while (3) directing microwave energy into the plasma chamber, whereupon hydrogen ions are accelerated by said microwave energy into said active layer whereby to reduce the resistivity of said active layer.

2. A method for manufacturing a semiconductor device as defined in claim 1, wherein said compound is selected from the group consisting of monosilanie, disilane and dichlorosilane.

3. A method for manufacturing a semiconductor device comprising the steps of forming an active layer for a transistor on a semiconductor substrate, forming a first insulating film overlying said active layer, forming a silicon nitride film on said first insulating film, forming a second insulating film on said silicon nitride film, forming a metallic plug penetrating said first insulating film, silicon nitride film and second insulating film to reach said active layer, forming a metallic layer on said second insulating film and said metallic plug, and forming a silicon oxide film on said silicon nitride film by a plasma enhanced chemical vapor deposition (CVD) technique in a plasma chamber using a compound of silicon and hydrogen while applying a radio frequency electric field to said substrate while directing microwave energy into the plasma chamber, whereupon hydrogen ions are accelerated by said microwave energy into said active laver whereby to reduce the resistivity of said active layer.

4. A method for manufacturing a semiconductor device as defined in claim 1 wherein said silicon nitride film has a thickness between 30 and 200 angstroms.

5. A method for manufacturing a semiconductor device comprising the steps of forming an active layer for a transistor on a semiconductor substrate, forming a first insulating film overlying said active layer, forming a silicon nitride film on said first insulating film, forming a second insulating film on said silicon nitride film, forming a metallic plug penetrating said first insulating film, silicon nitride film and second insulating film to reach said active layer, forming a metallic layer on said second insulating film and said metallic plug, and forming a silicon oxide film on said silicon nitride film by a plasma enhanced chemical vapor deposition (CVD) technique using a compound of silicon and hydrogen while applying a radio frequency electric field to said substrate.

6. A method for manufacturing a semiconductor device as defined in claim 5, wherein said compound is selected from the group consisting of monosilane, disilane and dichrolosilane.

7. A method for manufacturing a semiconductor device as defined in claim 5 wherein said first insulating film and silicon nitride film are formed by atmospheric-ressure CVD and low-pressure CVD, respectively.

8. A method for manufacturing a semiconductor device as defined in claim 5 wherein said silicon nitride film has a thickness between 30 and 200 angstroms.

* * * * *

UNITED STATES PATENT AND TRADEMARK OFFICE
CERTIFICATE OF CORRECTION

PATENT NO. : 6,071,832
DATED : JUNE 6, 2000
INVENTOR(S) : Hiraku ISHIKAWA

It is certified that error appears in the above-identified patent and that said Letters Patent is hereby corrected as shown below:

Claim 2, col. 6, line 19 "monosilanic" should be —monosilane—.

Claim 7, col. 6, line 60, "atmospheric--ressure" should be —atmospheric-pressure—.

Signed and Sealed this

Fifth Day of June, 2001

Attest:

Attesting Officer

NICHOLAS P. GODICI
*Acting Director of the United States Patent and Trademark Office*